United States Patent [19]

Sato

[11] Patent Number: 5,698,890
[45] Date of Patent: Dec. 16, 1997

[54] SEMICONDUCTOR DEVICE HAVING BIPOLAR TRANSISTOR FREE FROM LEAKAGE CURRENT ACROSS THIN BASE REGION

[75] Inventor: Fumihiko Sato, Tokyo, Japan

[73] Assignee: NEC Corporation, Japan

[21] Appl. No.: 526,893

[22] Filed: Sep. 12, 1995

[30] Foreign Application Priority Data

Sep. 12, 1994 [JP] Japan .................... 6-217351

[51] Int. Cl.⁶ .................... H01L 27/082; H01L 27/102
[52] U.S. Cl. .................... 257/592; 257/588
[58] Field of Search .................... 257/587, 588, 257/592, 591, 593

[56] References Cited

U.S. PATENT DOCUMENTS

| 5,296,391 | 3/1994 | Sato et al. | 437/31 |
| 5,321,301 | 6/1994 | Sato et al. | 257/592 |
| 5,323,032 | 6/1994 | Sato et al. | 257/592 |

FOREIGN PATENT DOCUMENTS

| 0429834 | 6/1991 | European Pat. Off. | |
| 4-330730 | 11/1992 | Japan | H01L 29/72 |

OTHER PUBLICATIONS

Sato et al; "A Self-Aligned Selective MBE Technology for High-Performance Bipolar Transistors"; Dec. 9-12, 1990; pp. 607-610; International Electron Devices Meeting 1990.

Sato et al; "Sub-20psec ECL Circuits with 50GHz fmax Self-Aligned SiGe HBTs"; 1992; pp. 397-400; International Electron Devices Meeting Technical Digest.

"Sub-20psec ECL Circuits with 50GHz fmax Self-aligned SiGe HBTs" Sato et al; International Electron Devices Meeting; 1992, IEEE; pp. 15.2.1-15.2.4.

*Primary Examiner*—Wael Fahmy
*Attorney, Agent, or Firm*—Hayes, Soloway, Hennessey, Grossman & Hage, P.C.

[57] ABSTRACT

A bipolar transistor includes a base structure in a hollow space on a single crystal silicon collector region defined by a silicon oxide layer, and the base structure has an extrinsic base provided around a single crystal silicon emitter region and an intrinsic base layer of single crystal silicon germanium decreasing the thickness from a central portion toward an outer periphery so as to decrease dislocation due to thermal stress in a heat treatment for the emitter region.

9 Claims, 8 Drawing Sheets

1

SEMICONDUCTOR DEVICE HAVING BIPOLAR TRANSISTOR FREE FROM LEAKAGE CURRENT ACROSS THIN BASE REGION

FIELD OF THE INVENTION

This invention relates to a semiconductor device and a process of fabrication thereof and, more particularly, to a semiconductor device including a bipolar transistor and a process of fabricating the semiconductor device.

DESCRIPTION OF THE RELATED ART

Various approaches have been proposed for speed-up of a bipolar transistor, and it is known that a thin base layer enhances the switching speed of the bipolar transistor. A typical example of the bipolar transistor equipped with a thin base layer and a fabrication process thereof are disclosed in Japanese Patent Publication of Unexamined Application No. 4-330730.

FIG. 1 illustrates the structure of the bipolar transistor disclosed in the Japanese Patent Publication of Unexamined Application. The bipolar transistor is fabricated on a p-type single crystal silicon substrate 1, and the resistivity of the silicon substrate 1 is regulated to be about 15 ohm-cm. A heavily arsenic-doped buried layer 2 is formed in a surface portion of the p-type single crystal substrate 1. On the buried layer 2 and the single crystal silicon substrate 1 is epitaxially grown a lightly doped n-type silicon collector layer 3 which is $5 \times 10^{15}$ cm$^{-3}$ in dopant concentration and 1.0 micron in thickness. The n-type silicon collector layer 3 is selectively oxidized through a selective oxidation technique, and a thick field oxide layer 4 penetrates through the n-type silicon collector layer 3 into the single crystal silicon substrate 1. The thick field oxide layer 4 thus penetrating into the single crystal silicon substrate 1 defines an active device area over the buried layer 2, and the thick field oxide layer 4 penetrating into the buried layer divides the active device area into two sub-areas. The left sub-area serves as a collector 3a of the bipolar transistor, and the right sub-area provides a heavily doped n-type collector contact region 3b through a phosphorous diffusion.

The silicon collector layer 3 is covered with a silicon oxide layer 5, and two holes 5a and 5b are formed in the silicon oxide layer 5. The collector 3a is partially exposed to the hole 5a, and the heavily-doped n-type collector contact region 3b is exposed to the other hole 5b.

A p-type polysilicon layer 6 is patterned on the silicon oxide layer 5, and has an over-hang portion 6a horizontally extending over the hole 5a. On the other hand, a single crystal p-type base region 7 occupies a bottom portion of the hole 5a, and forms a gap together with the over-hang portion 6a. The gap is filled with a p-type polysilicon layer 8, and the p-type polysilicon layer 8 is contiguous to the single crystal p-type base region 7. The p-type polysilicon layer 8 is grown from the bottom surface of the over-hang portion 6a, and does not occupy a central area of the upper portion of the hole 5a.

The other hole 5b is filled with an n-type polysilicon layer 9, and the n-type polysilicon layer 9 is held in contact with the collector contact region 3b.

A silicon nitride layer 10 covers an upper surface 6b and an inner side surface 6c of the p-type polysilicon layer 6 and the n-type polysilicon layer 9, and a side wall 11 of silicon oxide covers an inner side surface 8a of the p-type polysilicon 8. The bottom surface 11a of the side wall 11 reaches the upper surface of the single crystal base region 7, and exposes a narrow central area of the single crystal base region 7 to a narrow hole.

A single crystal n-type emitter region 12 occupies the narrow hole defined by the side wall 11, and is held in contact with the narrow central area of the single crystal base region 7 for forming a p-n junction. Contact holes 10a, 10b and 10c are formed in the silicon nitride layer 10, and a base electrode 13a, an emitter electrode 13b and a collector electrode 13c are held in contact through the contact holes 10a, 10b and 10c with the p-type polysilicon layer 6, the single crystal n-type emitter region 12 and the n-type polysilicon layer 9, respectively. These electrodes are formed of aluminum alloy.

The prior art bipolar transistor is fabricated through the process sequence illustrated in FIGS. 2A to 2C. In detail, after the selective growth of the thick field oxide layer 4, the silicon oxide layer 5 is deposited over the entire surface of the silicon collector layer 3 and the thick field oxide layer 4, and the hole 5b is formed in the silicon oxide layer 5 through lithographic techniques. The deposition allows the manufacturer to exactly control the thickness of the silicon oxide layer 5.

Polysilicon is deposited over the entire surface of the structure, and the hole 5b is filled with the polysilicon. The polysilicon layer is partially removed so as to separate a polysilicon piece for the collector contact from the polysilicon layer over the collector 3a. P-type dopant impurity is introduced into the polysilicon layer over the collector 3a, and n-type dopant impurity is introduced into the polysilicon piece, and the n-type polysilicon layer 9 is provided in the hole 5b.

The p-type polysilicon layer over the collector 3a is patterned by using an anisotropic etching technique so as to form a hole 14 over a central area of the collector 3a. Silicon nitride is deposited over the entire surface of the structure, and the hole 14 is filled with the silicon nitride. Using an anisotropic etching technique, the silicon nitride layer in the hole 14 is partially etched away until the silicon oxide layer 5 is exposed. The silicon nitride remains on the upper surface 6b and the inner edge 6c of the p-type polysilicon layer 6.

Using hot phosphoric acid solution, the silicon oxide layer 5 is laterally etched away from the surface exposed to the hole formed in the silicon nitride layer 10, and a hollow space 15 is formed in the silicon oxide layer 5. The hollow space 15 forms the over-hang portion 6a, and the collector 3a is exposed to the hollow space 15. The resultant structure is illustrated in FIG. 2A.

The single crystal p-type base region 7 and the p-type polysilicon layer 8 are grown from the exposed surface of the collector 3a and the bottom surface of the over-hang portion 6a, respectively, by using a gas-source molecular beam epitaxy, a ultra high vacuum chemical vapor deposition or a low-pressure chemical vapor deposition as shown in FIG. 2B.

The single crystal p-type base region 7 is upwardly grown, and the p-type polysilicon layer 8 is downwardly grown. Finally, the single crystal p-type base region 7 is merged with the p-type polysilicon layer 8 as shown in FIG. 2C, and the emitter 12 is formed in the remaining space 15. In order to heavily dope the emitter with n-type dopant impurity, a heat-treatment is carried out.

The single crystal base region 7 is epitaxially grown on the silicon collector layer 3, and serves as an intrinsic base. The silicon oxide layer 5 is, by way of example, on the order of 1100 angstroms, and the single crystal base region 7 is surely thinner than the silicon oxide layer 5. Thus, the prior art process provides a thin base region 7, and the prior art bipolar transistor improves the switching action by virtue of the thin base region 7.

Moreover, the emitter is formed through the hole 14 in a central portion of the remaining space 15, and is surely nested into the base region 7. This means that no nesting tolerance is required, and the prior art bipolar transistor occupies a relatively narrow area.

As proposed in the Japanese Patent Publication of Unexamined Application, the intrinsic base region 7 and the extrinsic base region 8 may be formed of single crystal silicon germanium and polysilicon silicon germanium, respectively, and the silicon germanium base structure further improves the switching action. Sato et al has proposed a base structure formed from an undoped SiGe layer. A graded SiGe layer and a heavily doped or lightly doped p-type silicon layer in IEDM (International Electron Devices Meeting), 1992, pages 397 to 400.

However, the prior art bipolar transistor with the silicon germanium base structure encounters a problem in a large amount of leakage current across the base region 7.

SUMMARY OF THE INVENTION

It is therefore an important object of the present invention to provide a semiconductor device which is free from the leakage current across a base region.

It is another important object of the present invention to provide a process of fabricating the semiconductor device free from the leakage current across the base region.

The present inventor contemplated the problem, and concluded that dislocation in the base region increased the leakage current.

In detail, the silicon oxide layer 5, the collector region 3a of single crystal silicon and the base region 7 of silicon germanium drew boundaries in the narrow space 15. The single crystal silicon was different in lattice constant from the silicon germanium, and the silicon oxide, the single crystal silicon and the silicon germanium were different in thermal expansion coefficient from one another. However, the drive-in stage for the emitter region 12 was carried out after the completion of the base structure, and the silicon oxide layer 5, the single crystal silicon collector 3a and the silicon germanium base structure 7/8 were heated during the drive-in stage. As a result, the strain in the base region 7 exceeded the critical value of the single crystal silicon, and the undesirable dislocation took place in the base region 7.

To accomplish the aforesaid object, the present invention proposes to decrease the thickness of a peripheral portion of a base structure preferably less than a critical thickness for dislocation.

In accordance with one aspect of the present invention, there is provided a semiconductor device having a bipolar transistor, the bipolar transistor comprising: a collector region of a first conductivity type formed of a first single crystal material; a first insulating layer formed of a first insulating material and on the collector region, and having a first hole exposing a surface of the collector region; a base electrode of a second conductivity type formed on the first insulating layer, and having an over-hang portion projecting over the first hole so as to define a second hole nested into the first hole, the second conductivity type being opposite to the first conductivity type; a base structure of the second conductivity type formed in the first hole, and held in contact with the surface of the collector region, the base structure including an intrinsic base layer of a second single crystal material different in thermal expansion coefficient from the first single crystal material and the first insulating material and having an oblique surface decreasing a thickness from a central portion of the intrinsic base layer below the second hole toward an outer periphery of the intrinsic base layer, and an extrinsic base layer formed between a lower surface of the over-hang portion and the intrinsic base layer; and an emitter region of the first conductivity type formed of the first single crystal material, and held in contact with a surface of the central portion of the intrinsic base layer below the second hole and a side surface of the extrinsic base layer.

In accordance with another aspect of the present invention, there is provided a process of fabricating a semiconductor device comprising the steps of: a) preparing a semiconductor foundation having a collector region of a first conductivity type formed of a first single crystal material; b) laminating a first insulating layer formed of a first insulating material on the collector region and a first semiconductor layer formed of a first poly-crystal material on the first insulating layer; c) patterning the first semiconductor layer so as to form a base electrode of a second conductivity type opposite to the first conductivity type and having a hole exposing a surface of the first insulating layer; d) covering an upper surface and an inner edge of the base electrode with a second insulating layer of a second insulating material; e) etching the first insulating layer by using an etchant selective between the first insulating material and the second insulating material for forming a hollow space laterally extending from the hole and exposing the collector region and a lower surface of the base electrode to the hollow space; f) growing a second single crystal material different in thermal expansion coefficient from the first single crystal material and the first insulating material on the collector region under conditions such that the amount of the second single crystal material being grown being decreased from a central portion below the hole toward an inner surface of the first insulating layer defining the hollow space, thereby forming an intrinsic base layer of the second conductivity type on the collector region; g) completing an extrinsic base layer formed between the lower surface of the base electrode and the intrinsic base layer; and h) forming an emitter region of the first conductivity type formed of the first single crystal material and on the intrinsic base layer and surrounded by the extrinsic base layer.

BRIEF DESCRIPTION OF THE DRAWINGS

The features and advantages of the semiconductor device and the fabrication process according to the present invention will be more clearly understood from the following description taken in conjunction with the accompanying drawings in which.

DESCRIPTION OF THE PREFERRED EMBODIMENTS

First Embodiment

Figure 1:
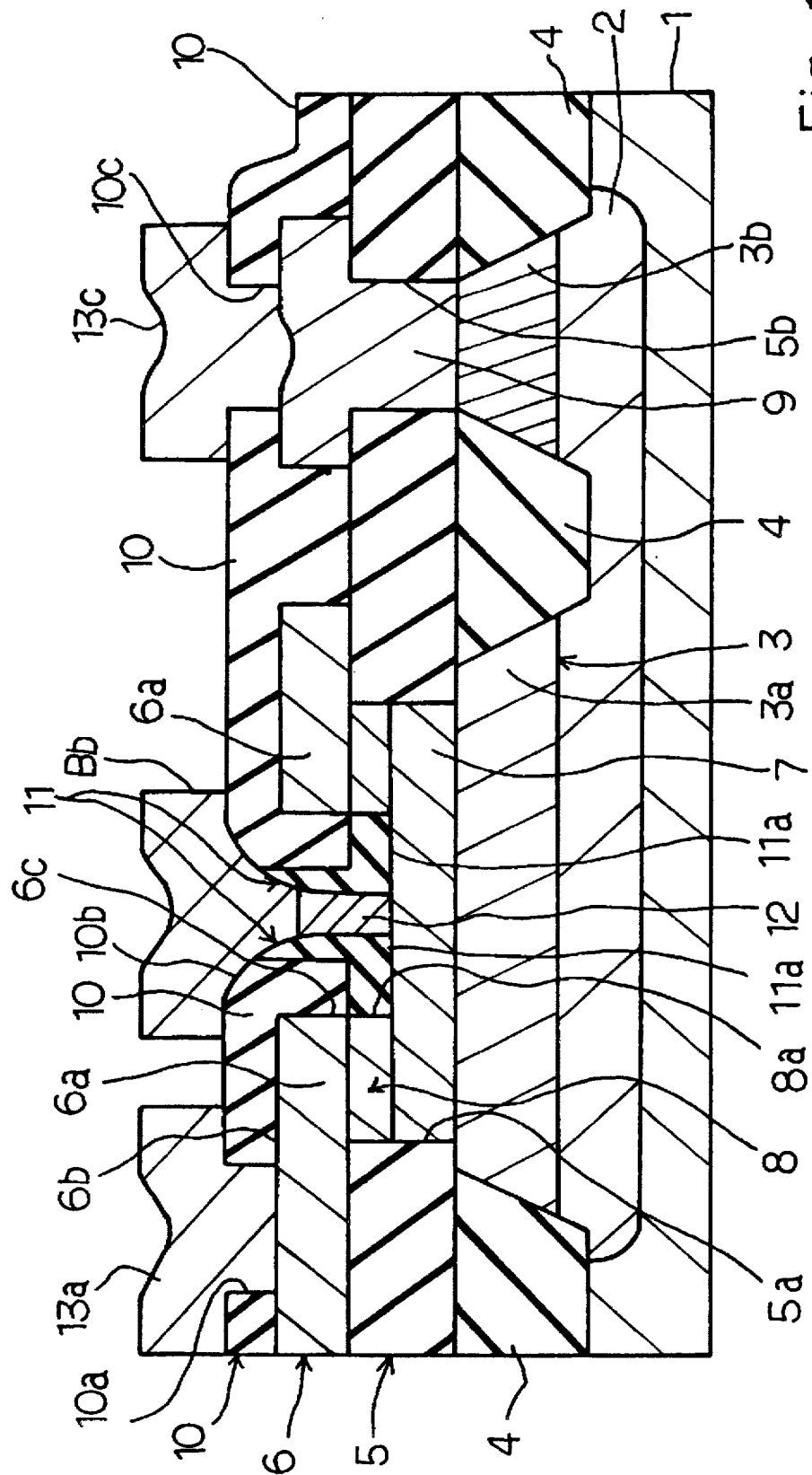
FIG. 1 is a cross sectional view showing the structure of the prior art bipolar transistor.
Figure 2A:
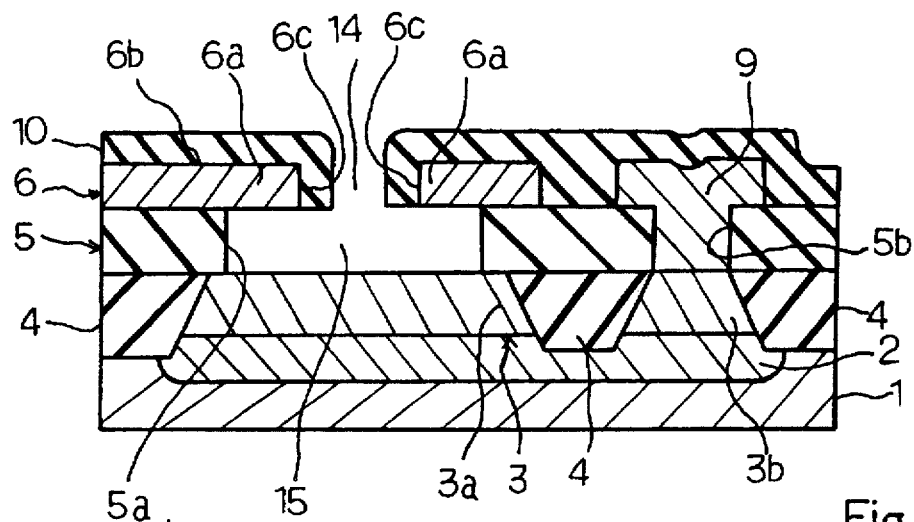
FIGS. 2A to 2C are cross sectional views showing the prior art process sequence for the bipolar transistor.
Figure 2B:
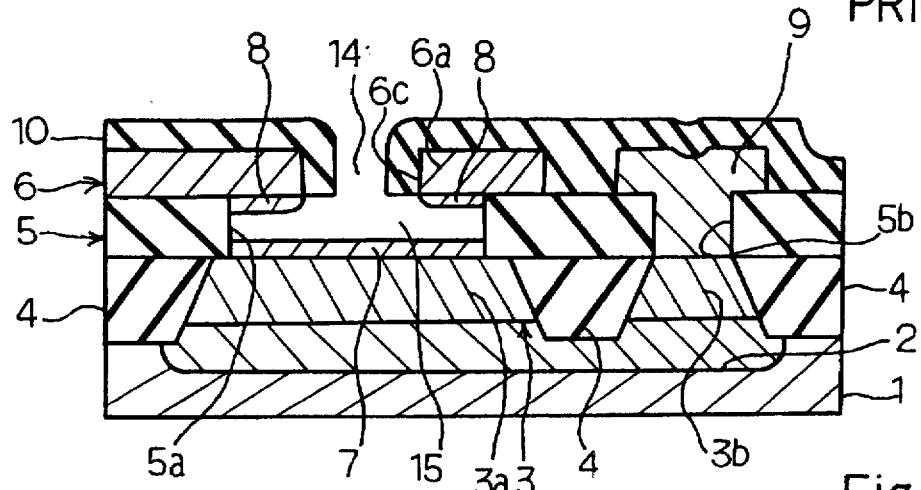
Figure 2C:
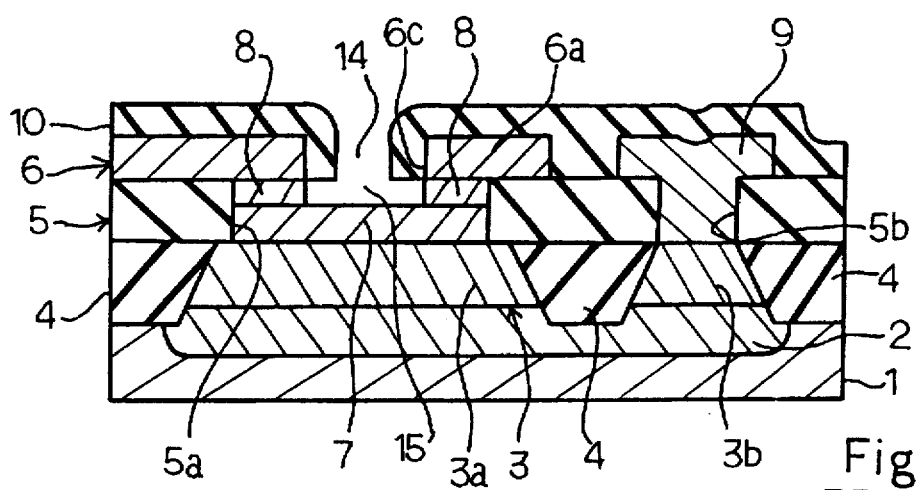
Figure 3:
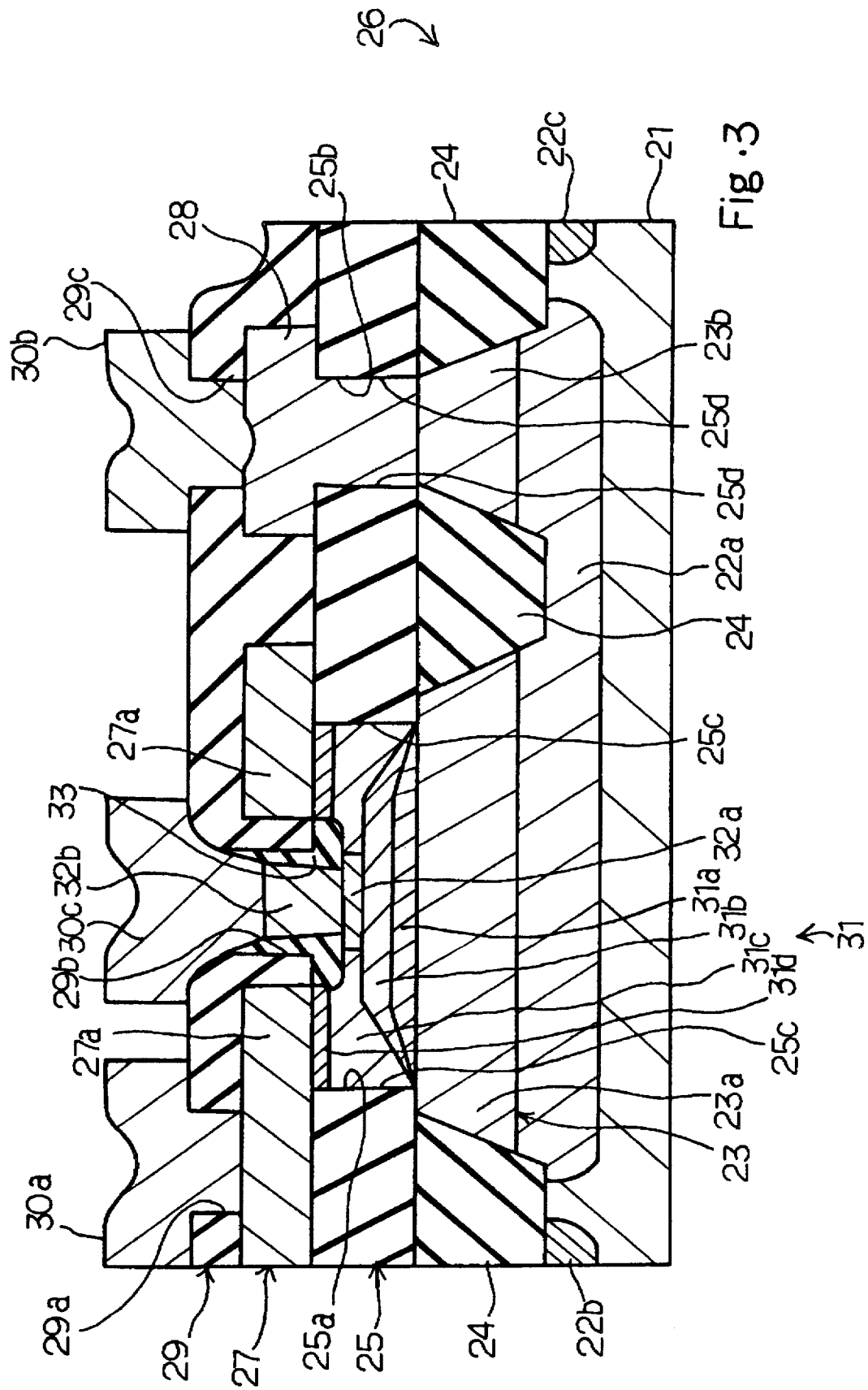
FIG. 3 is a cross sectional view showing the structure of a bipolar transistor according to the present invention.

Referring first to FIG. 3 of the drawings, a bipolar transistor embodying the present invention is fabricated on a lightly doped p-type single crystal silicon substrate 21. The lightly doped p-type single crystal silicon substrate 21 ranges from 10 ohm-cm to 20 ohm-cm at room temperature, and is oriented to (100) crystal direction.

Arsenic or antimony is diffused into a part of the lightly doped p-type single crystal silicon substrate 21, and a heavily doped n-type buried layer 22a is formed in the part of the lightly doped p-type single crystal silicon substrate 21. On both sides of the heavily doped n-type buried layer 22a boron is doped into the lightly doped p-type single crystal silicon substrate 21, and forms heavily doped p-type channel stopper regions 22b and 22c.

An n-type single crystal silicon layer 23 is epitaxially grown on the lightly doped p-type single crystal silicon substrate 21, buried layer doped n-type buried layer 22a and the heavily doped p-type channel stopper regions 22b and 22c. The n-type single crystal silicon layer 23 is doped with phosphorus at $1 \times 10^{17}$ cm$^{-3}$, and is on the order of 0.4 micron thick.

A thick field oxide layer 24 protrudes from the surface of the n-type single crystal silicon layer 23 into the lightly doped p-type single crystal silicon substrate 21 and the heavily doped n-type buried layer 22a, and the heavily doped p-type channel stopper regions 22b and 22c are beneath the thick field oxide layer 24. The thick field oxide layer 24 is 4000 angstroms thick, and a local oxidation of silicon technology is available for the growth of the thick field oxide layer 24. The thick field oxide layer 24 electrically isolates active areas from one another together with the heavily doped p-type channel stopper regions 22b/22c. FIG. 3 shows one of the active areas assigned to the bipolar transistor. A part of the thick field oxide layer 24 reaches the heavily doped n-type buried layer 22a, and separates a single crystal silicon collector region 23a from a collector contact region 23b. The collector contact region 23b is heavily doped with phosphorus.

The n-type single crystal silicon layer 23 and the thick field oxide layer 24 are covered with a silicon oxide layer 25, and the silicon oxide layer 25 is of the order of 1000 angstroms thick. A hollow space 25a and a contact hole 25b are formed in the silicon oxide layer 25. The hollow space 25a exposes the surface of the single crystal silicon collector region 23a, and the heavily doped n-type collector contact region 23b is exposed to the contact hole 25b. The inner surfaces 25c and 25d partially define the hollow space 25a and the contact hole 25b, respectively, and extend in <110> direction perpendicular to the paper where FIG. 3 is drawn.

The structure below the silicon oxide layer 25 is hereinbelow referred to as "silicon foundation 26", and the lightly doped p-type single crystal silicon substrate 21, the heavily doped n-type buried layer 22a, the heavily doped p-type channel stopper regions 22b/22c, the n-type single crystal silicon layer 23 and the thick field oxide layer 24 form in combination the silicon foundation 26.

A p-type polysilicon base electrode 27 is provided on the silicon oxide layer 25, and has an over-hang portion 27a. The over-hang portion 27a extends over the periphery of the hollow space 25a, and, accordingly, the lower surface of the over-hang portion 27a is exposed to the hollow space 25a. The horizontal length of the over-hang portion 27a is greater than the thickness of the silicon oxide layer 25.

The contact hole 25b is plugged with an n-type polysilicon collector electrode 28, and the n-type polysilicon collector electrode 28 projects over the upper surface of the silicon oxide layer 25. The n-type polysilicon collector electrode 28 is held in contact with the n-type collector contact region 23b.

The p-type polysilicon base electrode 27, the n-type polysilicon collector electrode 28 and the exposed surface of the silicon oxide layer 25 are covered with a silicon nitride layer 29, and contact holes 29a, 29b and 29c are formed in the silicon nitride layer 29. The contact hole 29a exposes a part of the p-type polysilicon base electrode 27, and a metallic base electrode 30a of aluminum alloy is held in contact through the contact hole 29a with the p-type polysilicon base electrode 27. The contact hole 29c exposes a part of the n-type polysilicon collector electrode 28, and a metallic collector electrode 30b of aluminum is also held through the contact hole 29c with the n-type polysilicon collector electrode 28.

A base structure 31 is provided on the single crystal silicon collector region 23a, and includes an undoped single crystal silicon germanium layer 31a on the single crystal silicon collector region 23a, a heavily doped p-type single crystal silicon germanium layer 31b laminated on the undoped single crystal silicon germanium layer 31a, a heavily doped p-type single crystal silicon layer 31c on the peripheral area of the heavily doped p-type single crystal silicon germanium layer 31b and a p-type poly-crystal laminated structure 31d between the lower surface of the over-hang portion 27a and the heavily doped p-type single crystal silicon layer 31c. The p-type poly-crystal laminated structure 31d is partially formed of silicon germanium and partially formed of silicon. Term "undoped" does not mean the intrinsic semiconductor. As described hereinbelow in conjunction with the fabrication process, the undoped single crystal silicon germanium layer 31a has a dopant concentration of less than $4 \times 10^{16}$ cm$^{-3}$, and is deemed to be undoped. The undoped single crystal silicon germanium layer 31a is expressed as $Si_{0.9}Ge_{0.1}$, and the heavily doped p-type single crystal silicon germanium layer 31b has the same composition as the undoped single crystal silicon germanium layer 31a. The undoped single crystal silicon germanium layer 31a and the heavily doped p-type single crystal silicon germanium layer 31b are decreased in thickness toward the outer peripheries thereof, and have respective trapezoidal cross sections.

On the other hand, the heavily doped p-type single crystal silicon layer 31c is increased in thickness toward the outer periphery thereof, and the sloped portion of the heavily doped p-type single crystal silicon layer 31c is held in contact with the sloped portion of the heavily doped p-type single crystal silicon germanium layer 31b.

A heavily doped n-type single crystal silicon emitter region 32a is held in contact with a central area of the heavily doped p-type single crystal silicon germanium layer 31b, and is surrounded by the heavily doped p-type single crystal silicon layer 31c.

A silicon oxide wall 33 covers the inner surface of the silicon nitride layer 29 defining the contact hole 29b, and the lower surface of the silicon oxide wall 22 is held in contact with the periphery of the heavily doped n-type single crystal silicon emitter region 32a. As a result, a central area of the heavily doped n-type single crystal silicon emitter region 32a is exposed to a hole defined by the silicon oxide wall 33.

A heavily doped n-type polysilicon emitter electrode 32b is formed in the hole defined by the silicon oxide wall 33, and is held in contact with the heavily doped n-type single crystal silicon emitter region 32a. A metallic emitter electrode 30c of aluminum alloy is in contact with the heavily doped n-type polysilicon emitter electrode 32b.

The bipolar transistor shown in FIG. 3 is fabricated through a process described hereinbelow with reference to FIGS. 4A to 4G.

The process starts with preparation of the lightly doped p-type single crystal silicon substrate 21. The surface orientation is (100), and the resistivity ranges between 10 ohm-cm and 20 ohm-cm as described hereinbefore.

The heavily doped n-type buried layer 22a and the heavily doped p-type channel stopper regions 22b and 22c are formed in the surface portions of the lightly doped p-type single crystal silicon substrate 21.

In detail, a silicon dioxide layer (not shown) is thermally grown in or deposited through a chemical vapor deposition on the entire surface portion of the lightly doped p-type single crystal silicon substrate 21 to 5000 angstroms thick, and a photo-resist mask (not shown) is provided on the silicon dioxide layer for the heavily doped n-type buried layer 22a. The exposed silicon dioxide layer is firstly etched away through a reactive ion etching of 4000 angstroms, and the remaining exposed silicon dioxide is etched away by a hydrofluoric acid-based etch. Then, the lightly doped p-type single crystal silicon substrate 21 is partially exposed to a hole formed in the silicon dioxide layer, and the photo-resist mask is removed from the structure. Arsenic is ion implanted into the exposed portion of the lightly doped p-type single crystal silicon substrate 21 at dose of $5 \times 10^{15}$ cm$^{-2}$ under acceleration energy of 70 keV. The implanted arsenic is driven into the lightly doped p-type single crystal silicon substrate 21 through a heat treatment in a nitrogen atmosphere at 1100 degrees centigrade for four hours. Upon completion of the heat treatment, the heavily doped n-type buried layer 22a is formed in the surface portion of the lightly doped p-type single crystal silicon substrate 21, and is 2 microns in depth. The silicon dioxide layer is removed using the hydrofluoric acid-based etchant solution.

Subsequently, an appropriate photo-resist mask (not shown) is formed through lithographic techniques for the heavily doped p-type channel stopper regions 22b and 22c, and exposes areas on both sides of the heavily doped n-type buried layer 22a. Boron is ion implanted into the exposed areas at a dose of $1 \times 10^{13}$ cm$^{-2}$ under an acceleration energy of 100 keV, and the implanted boron forms the heavily doped p-type channel stopper regions 22b and 22c.

The photo-resist mask is stripped off, and a heat treatment is carried out in a nitrogen atmosphere at 1000 degrees centigrade for 30 minutes. As a result, the lightly doped p-type single crystal silicon substrate 21 is cured from crystal damage due to the ion implantation.

When the heavily doped n-type buried layer 22a and the heavily doped p-type channel stopper regions 22b and 22c are formed in the lightly doped p-type single crystal silicon substrate 21, the n-type single crystal silicon layer 23 is epitaxially grown on the lightly doped p-type single crystal silicon substrate 21 to 0.4 micron thick by using an ordinary silicon epitaxial growth technique, and phosphorus is doped into the n-type single crystal silicon layer 23 at a concentration of $1 \times 10^{17}$ cm$^{-3}$.

The n-type single crystal silicon layer 23 is thermally oxidized, and a silicon oxide layer (not shown) 500 angstroms thick covers the n-type single crystal silicon layer 23. Silicon nitride is deposited over the silicon oxide layer to a thickness of 1000 angstroms by using a low-pressure chemical vapor deposition technique, and a silicon nitride layer (not shown) is laminated on the silicon oxide layer. An appropriate photo-resist mask (not shown) is provided on the silicon nitride layer for the thick field oxide layer 24, and the silicon nitride layer, the silicon oxide layer and the n-type single crystal silicon layer 23 are partially etched away by using anisotropic dry etching. Then, a moat (not shown) is formed through the n-type single crystal silicon layer 23, and the depth of the n-type single crystal silicon layer 23 etched away is approximately 2100 angstroms.

Figure 4A:
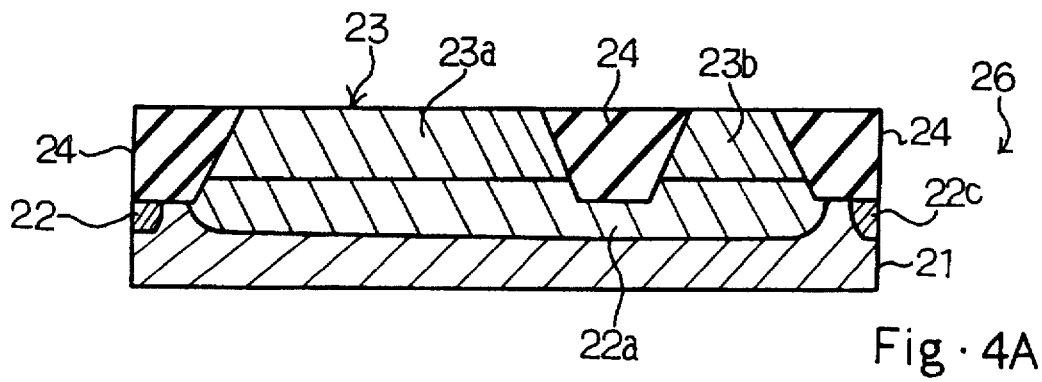
FIGS. 4A to 4G are cross sectional views showing a process sequence for the bipolar transistor according to the present invention.

The photo-resist mask is stripped off, and the thick field oxide layer 24 is grown in the moat to a thickness of 4000 angstroms through the oxidation. The thick field oxide layer 24 penetrates into the surface portions of the lightly doped p-type single crystal silicon substrate 21. The silicon foundation 26 is dipped in hot phosphoric acid, and the silicon nitride layer is removed from the n-type single crystal silicon layer 23. The resultant structure is illustrated in FIG. 4A.

The silicon oxide layer 25 is thermally grown or deposited through the chemical vapor deposition on the silicon foundation 26 to a thickness of 1300 angstroms.

An appropriate photo-resist mask (not shown) is provided on the silicon oxide layer 25 for the collector contact hole 25b by using lithographic techniques, and the exposed silicon oxide layer 25 is partially removed by using a dry etching or a wet etching in hydrofluoric acid solution. Then, the collector contact hole 25b is formed in the silicon oxide layer 25.

Phosphorus is ion implanted into the exposed n-type single crystal silicon layer 23 at dose of $5 \times 10^{15}$ cm$^{-2}$ under acceleration energy of 70 keV. The photo-resist mask for the collector contact hole 25b is stripped off, and a heat treatment in a nitrogen atmosphere at 900 degrees centigrade for 30 minutes cures the n-type single crystal silicon layer 23 from crystal damages due to the ion-implantation. Thus, the heavily doped n-type collector contact region 23b is formed below the collector contact hole 25b.

Figure 4B:
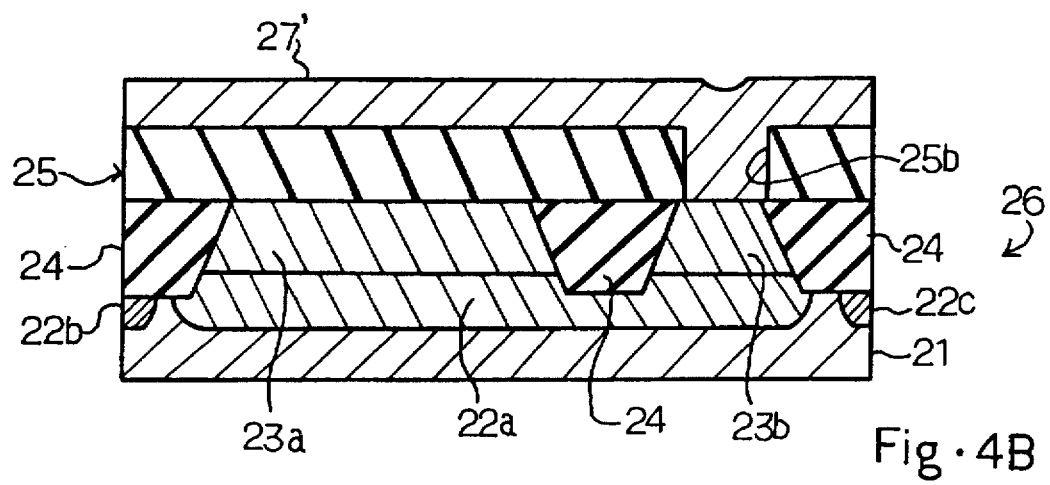

Natural oxide is removed from the heavily doped n-type collector contact region 23b exposed to the collector contact 25b by using the hydrofluoric acid solution, and undoped polysilicon is deposited over the entire surface of the structure through low-pressure chemical vapor deposition to a thickness of 2500 angstroms. As a result, an undoped polysilicon layer 27' covers the upper surface of the silicon oxide layer 25, and plugs the collector contact hole 25b. The resultant structure is illustrated in FIG. 4B.

An appropriate photo-resist mask (not shown) is provided on the undoped polysilicon layer 27' for the heavily doped n-type polysilicon electrode 28, and phosphorus is ion implanted into the exposed undoped polysilicon layer at dose of $5 \times 10^{15}$ cm$^{-2}$ under acceleration energy of 70 keV. After the ion-implantation, the photo-resist mask is stripped off. Thus, the undoped polysilicon layer 27' is partially doped with the n-type dopant impurity.

An appropriate photo-resist mask (not shown) is provided on the remaining undoped polysilicon layer 27' for the heavily doped p-type polysilicon base electrode 29. Using the photo-resist mask, boron is ion implanted into the exposed undoped polysilicon layer at dose of $5 \times 10^{15}$ cm$^{-2}$ under acceleration energy of 15 keV. As a result, the heavily doped p-type polysilicon base electrode 29 is formed in the remaining polysilicon layer 27'. The photo-resist mask is stripped off.

Figure 4C:
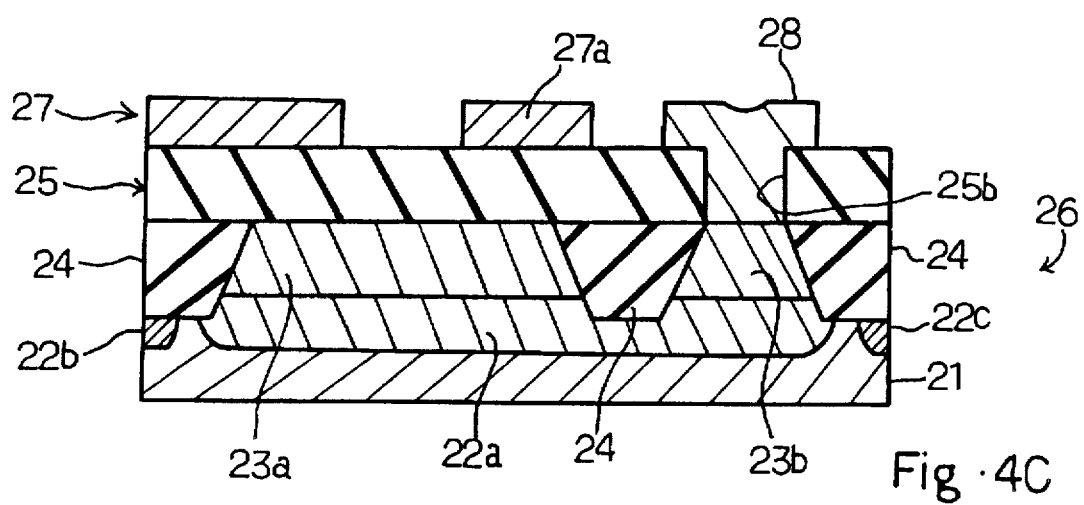

An appropriate photo-resist mask (not shown) is provided for the heavily doped p-type polysilicon base electrode 27. A dry etching patterns the remaining polysilicon layer 27' into the heavily doped p-type polysilicon base electrode 2, and separates the heavily doped p-type polysilicon base electrode 27 from the heavily doped n-type polysilicon collector electrode 28. The resultant structure is illustrated in FIG. 4C.

Subsequently, silicon nitride is deposited through a low-pressure chemical vapor deposition to a thickness of 1500 angstroms over the entire surface of the structure, and, accordingly, a silicon nitride layer (not shown) covers the heavily doped p-type polysilicon base electrode 29, the heavily doped n-type polysilicon collector electrode 28 and the exposed surface of the silicon oxide layer 25. An appropriate photo-resist mask is provided on the silicon nitride layer, and an anisotropic dry etching removes a part of the silicon nitride layer on the silicon oxide layer 6 in the hole formed in the heavily doped p-type polysilicon base electrode 27 and another exposed surface of the heavily doped p-type polysilicon base electrode 27. The photo-resist mask is stripped off.

Silicon nitride is deposited over the entire surface of the structure through the low-pressure chemical vapor deposition again, and a silicon nitride layer of 1200 angstroms in thickness covers the silicon nitride layer on the heavily doped p-type polysilicon base electrode 27 and the exposed surface of the silicon oxide layer 28. The silicon nitride layer on the heavily doped p-type polysilicon base electrode 27 increases the thickness. The dry etching uniformly removes the silicon nitride until a thickness of 1200 angstroms is reached, and the silicon nitride layer 29 is completed on the heavily doped p-type polysilicon base electrode 27. The inner edge of the heavily doped p-type polysilicon base electrode 27 is covered with the silicon nitride, and the silicon nitride defines the hole 29b. However, the silicon oxide layer 25 is exposed to the hole 29b again. The silicon nitride is also left on the upper and side surfaces of the heavily doped n-type polysilicon collector electrode 28.

Subsequently, the resultant structure is dipped into hydrofluoric acid solution, and the silicon oxide layer 25 is exposed through the hole 29b to the hydrofluoric acid solution. The hydrofluoric acid solution etches the silicon oxide away, and the hollow space laterally expands. As a result, the lower surface of the heavily doped p-type polysilicon base electrode 27 is exposed to the hollow space 25a, and the over-hang portion 27a is completed.

The width of the exposed lower surface or the distance between the inner edge 25c and the inner edge of the heavily doped p-type polysilicon base electrode 27 is, by way of example, 2000 angstroms. The width of the exposed lower surface is equal to or greater than the width of the intrinsic base 31a/31b on the collector 23a, and is equal to or less than the thickness of the heavily doped p-type polysilicon base electrode 27. If the width of the lower surface is greater than the thickness of the polysilicon base electrode 27, the heavily doped p-type polysilicon base electrode dominates the base resistance. On the other hand, if the width of the lower surface is less than the width of the intrinsic base 31a/31b, the intrinsic base 31a/31b dominates the base resistance.

Figure 4D:
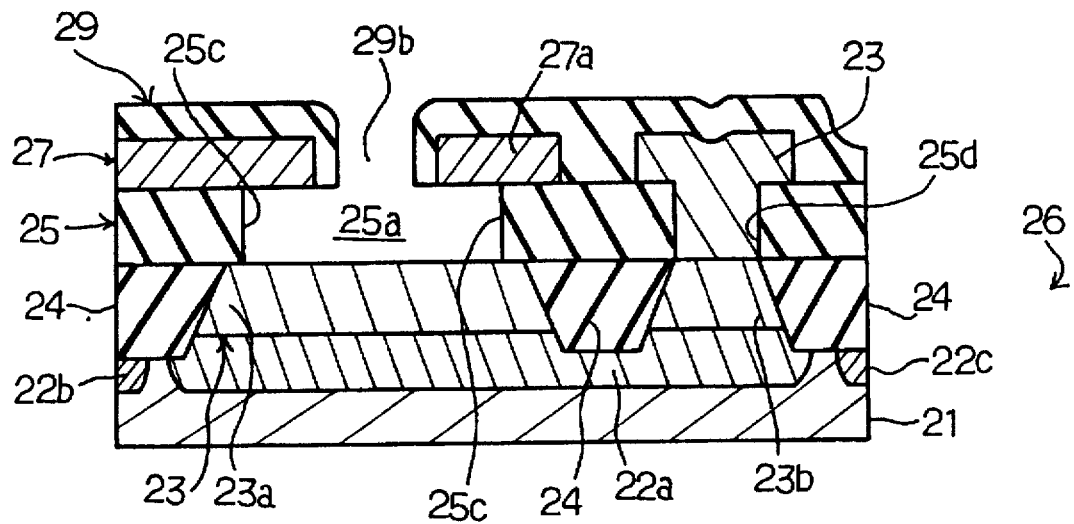

The wet etching in the hydrofluoric acid solution results in the structure shown in FIG. 4D.

Figure 4E:
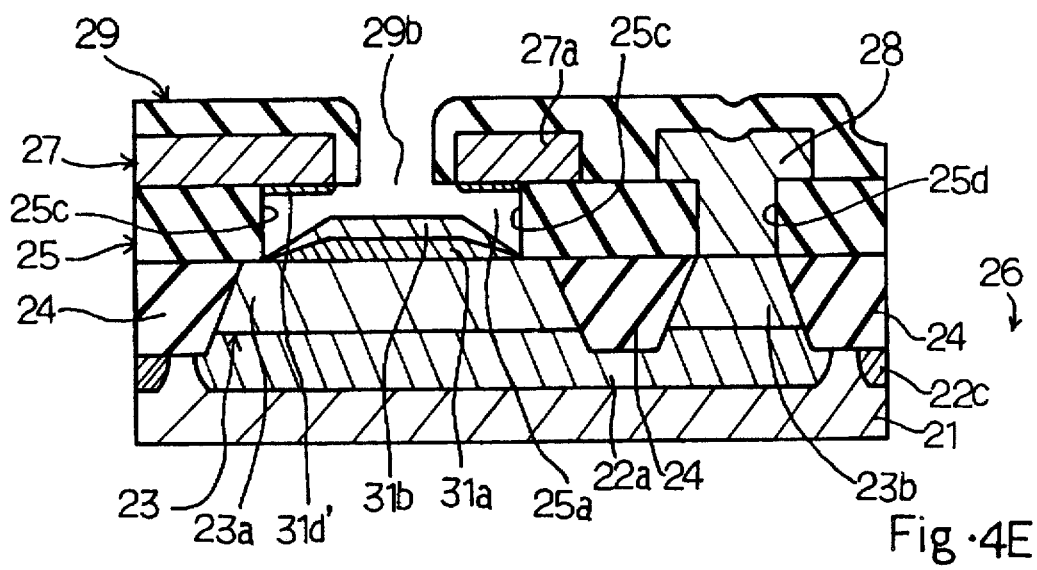

Subsequently, the undoped single crystal silicon germanium layer 31a and the heavily doped p-type single crystal silicon germanium layer 31b are successively grown on the n-type single crystal silicon collector region 23a by using a selectively growth technique such as, for example, a gas source molecular beam epitaxy, an ultra high vacuum chemical vapor deposition or a low-pressure chemical vapor deposition. The selective growth technique grows poly-crystal material on a poly-crystal layer and single-crystal material on a single crystal layer, but does not grow the poly-crystal material and the single-crystal material on an oxide layer and a nitride layer. For this reason, the p-type poly-crystal silicon germanium layer 31d is grown from the lower surface of the over-hang portion 27a, but the silicon germanium is not grown on the exposed inner edge 25c of the silicon oxide layer 25 and an exposed surface of the silicon nitride layer 29 as shown in FIG. 4E.

The growing conditions are appropriately controlled during the selective growth, and the undoped single crystal silicon germanium layer 31a and the heavily doped p-type single crystal silicon germanium layer 31b have respective trapezoidal cross sections. Namely, the central portions beneath the hole 29b are thick, and the thicknesses are gradually decreased by increasing the distance from the hole 29b toward the inner edges 25c. The trapezoidal cross sections are achieved by a controlling supply rate. Namely, when the selective growth is carried out under a high growing temperature and a small amount of process gas, a substantial amount of the process gas is consumed beneath the hole 29b, and the amount of process gas is gradually decreased from the central portion toward the peripheral portion. This results in the trapezoidal cross sections.

The undoped single crystal silicon germanium layer 31a and the heavily doped p-type single crystal silicon germanium layer 31b are assumed to be grown through ultra high vacuum chemical vapor deposition. The growing conditions are as follows. The substrate temperature is 700 degrees centigrade, and the process gas contains 3 sccm $Si_2H_6$, 2 sccm of $GeH_4$, and 0.03 sccm of $Cl_2$.

In this instance, the undoped single crystal silicon germanium layer 31a is less in dopant concentration than $4\times10^{16}$ $cm^{-3}$, and the central flat portion thereof is about 150 angstroms thick. On the other hand, the heavily doped p-type single crystal silicon germanium layer 31b is doped with boron at $7\times10^{18}$ $cm^{-3}$, and the central flat portion thereof is about 450 angstroms thick.

It is desirable to decrease the thickness of the outer peripheral portions of the undoped/heavily doped p-type silicon germanium single crystal layers 31a and 31b less than a critical thickness of $Si_{0.9}Ge_{0.1}$ for dislocation. The peripheral portions less in thickness than the critical thickness do not allow dislocation due to thermal stress to take place. The critical thickness of $Si_{0.9}Ge_{0.1}$ is of the order of 300 to 400 angstroms.

The selective growth is continued for the heavily doped p-type single crystal silicon layer 31c. If ultra high vacuum chemical vapor deposition is used for the heavily doped p-type single crystal silicon layer 31c, the growing conditions are that the substrate temperature is 590 degrees centigrade and the process gas contains 3 sccm of $Si_2H_6$ 0.03 sccm of $Cl_2$. These growing conditions result in the heavily doped p-type single crystal silicon layer 31c increasing in thickness from the central flat portion toward the outer periphery. In this instance, the heavily doped p-type single crystal silicon layer 31c is doped with boron at a concentration of $7\times10^{18}$ $cm^{-3}$, and the central flat portion thereof is about 250 angstroms thick.

Figure 4F:
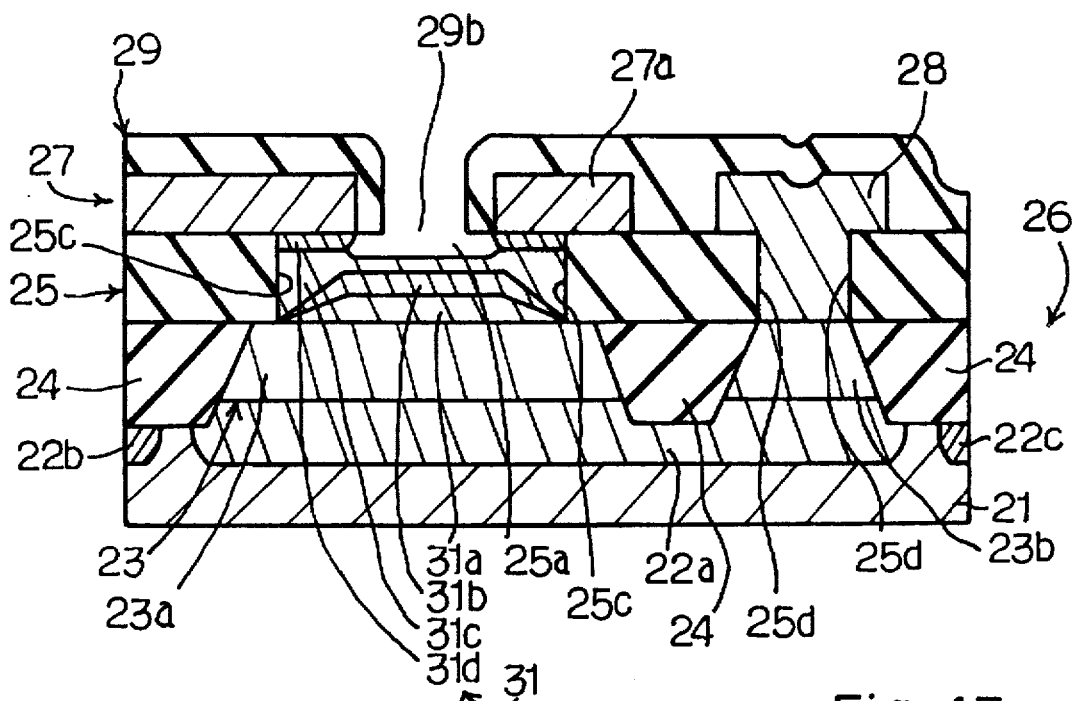

While the ultra high vacuum chemical vapor deposition is growing the heavily doped p-type single crystal silicon layer 31c, the polysilicon is grown from the p-type poly-crystal silicon germanium layer 31d', and is merged with the heavily doped p-type polysilicon layer 31c. As a result, the p-type poly-crystal laminated structure 31d is formed between the heavily doped p-type single crystal silicon layer 31c and the lower surface of the heavily doped polysilicon base electrode 27. Thus, the base structure 31 is completed in the hollow space 25a as shown in FIG. 4F.

In this instance, the undoped single crystal silicon germanium layer 31a and the heavily doped p-type single crystal silicon germanium layer 31b form in combination an intrinsic base layer, and the p-type poly-crystal laminated structure 31d and the heavily doped single crystal silicon layer 31c as a whole constitute an extrinsic base layer.

Subsequently, silicon oxide is deposited over the entire surface of the structure by using low-pressure chemical vapor deposition, and a silicon oxide layer (not shown) covers the silicon nitride layer 27 and the base structure 31 in the hollow space 25a. The anisotropic dry etching removes the silicon oxide on the upper surface of the silicon nitride layer 27 and the base structure 31, however, the side wall 33 is left on the inner vertical surface of the silicon nitride layer 27.

Polysilicon is deposited over the entire surface of the structure, and arsenic is doped during the deposition of the polysilicon. The arsenic-doped polysilicon layer (not shown) is patterned into the heavily doped n-type polysilicon emitter electrode 32b through the anisotropic dry etching without a mask, and the heavily doped n-type polysilicon emitter electrode 32b is $1 \times 10^{21}$ cm$^{-3}$ in dopant concentration and 1700 angstroms in thickness.

In this instance, the uniform anisotripic etching or an etch-back technique forms the heavily doped n-type polysilicon emitter electrode 32b in the hole defined by the side wall 33. The heavily doped n-type polysilicon layer may be patterned into the heavily doped n-type emitter electrode 32b by using lithographic techniques. Undoped polysilicon deposited by low-pressure chemical vapor deposition may be ion implanted with n-type dopant impurity instead of in-situ doping.

Figure 4G:
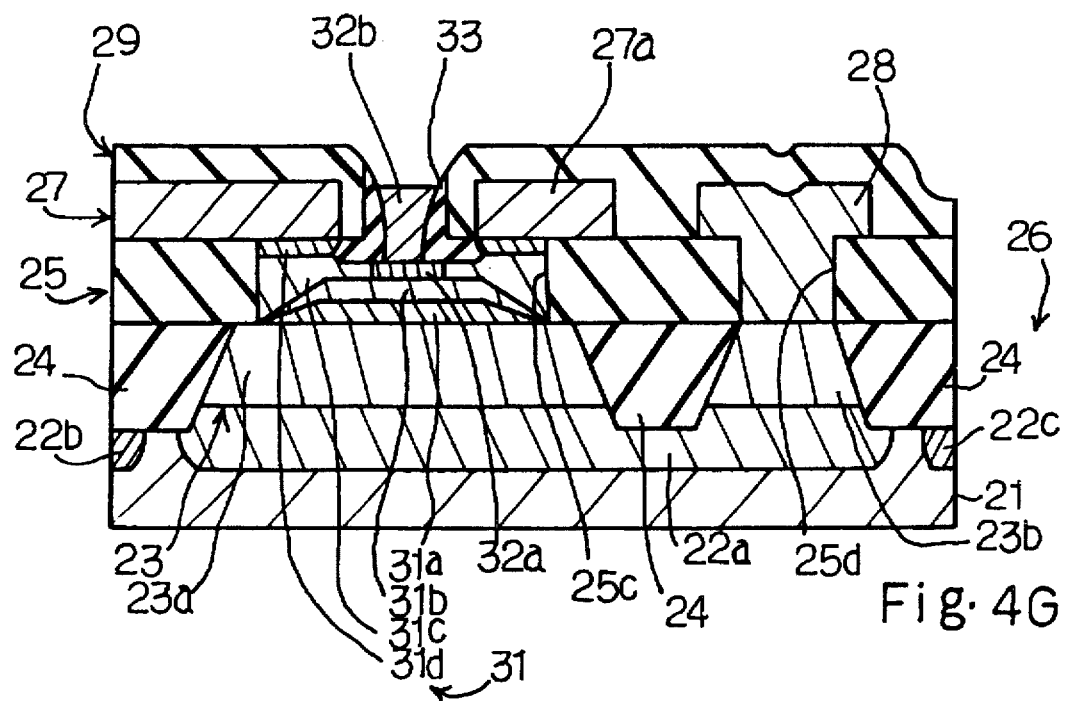
Figure 5:
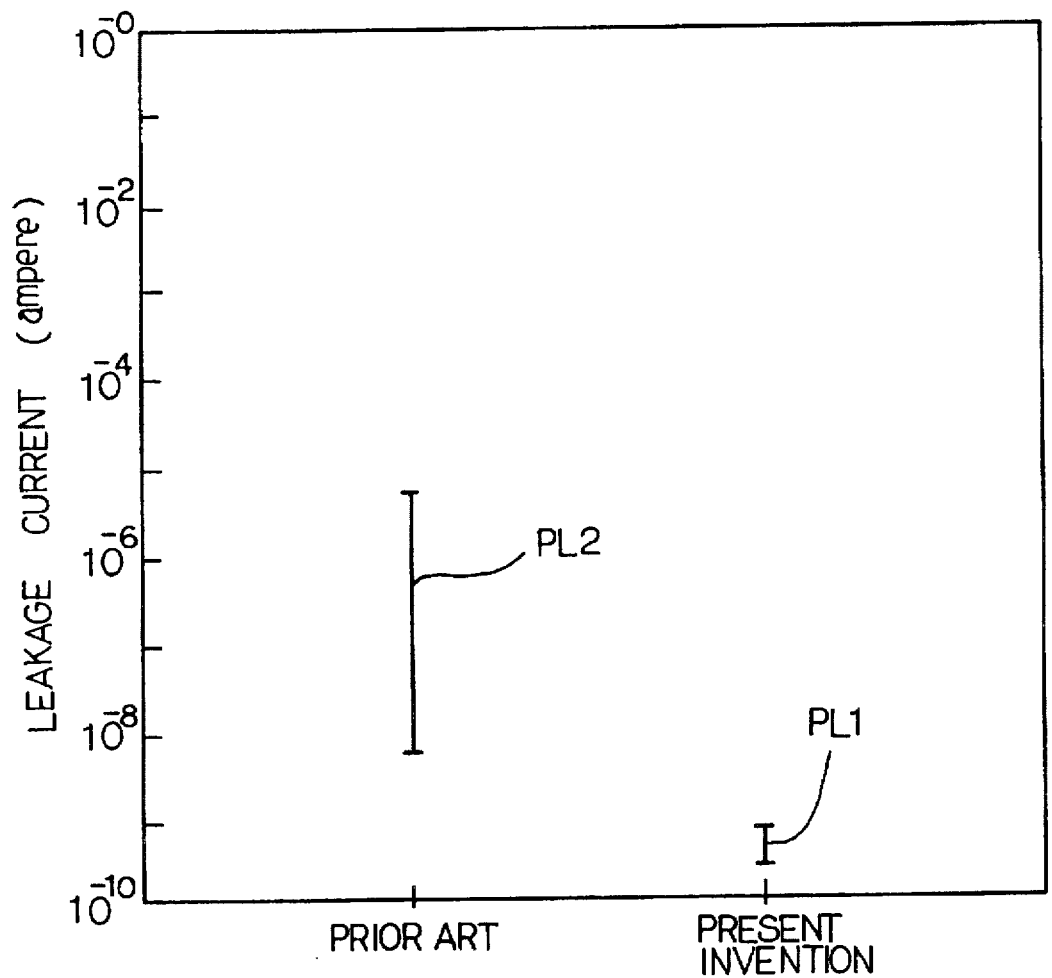
FIG. 5 is a graph showing leakage current between the bipolar transistor according to the present invention and the prior art bipolar transistor.

The heavily doped n-type polysilicon emitter electrode 32b is heated so as to diffuse the arsenic into a central portion of the heavily doped p-type silicon layer 31c, and the emitter region 32a is formed as shown in FIG. 4G.

While the heat is being applied for diffusing the arsenic, the silicon oxide layer 25, the single crystal silicon collector region 23a and the undoped/heavily doped p-type silicon germanium layers 31a and 31b differently expand, and thermal stress takes place in the undoped/heavily doped and 31 silicon germanium layers 31a and 31b. However, the thin peripheral portions prevent the undoped/heavily doped p-type silicon germanium layers 31a/31b from dislocation due to the thermal stress.

Subsequently, an appropriate photo-resist mask (not shown) is provided on the silicon nitride layer 29 for the base contact hole 29a and the collector contact hole 29c, and the exposed portions of the silicon nitride layer 29 are removed so as to expose the heavily doped p-type polysilicon base electrode 27 and the heavily doped n-type polysilicon collector electrode 28 to the base contact hole 29a and the collector contact hole 29c. The photo-resist mask is stripped off.

Conductive alloy such as aluminum containing 1 percent silicon is sputtered onto the entire surface of the structure, and the sputtering fills the base contact hole 29a, the hole over the emitter electrode 32b and the collector contact hole 29c with the conductive alloy. An appropriate photo-resist mask (not shown) is provided on the conductive alloy layer, and the conductive alloy layer is patterned into the metallic base electrode 30a, the metallic emitter electrode 30c and the metallic collector electrode 30b. Thus, the bipolar transistor shown in FIG. 3 is completed.

As will be appreciated from the foregoing description, the silicon germanium is grown at relatively high temperature, and the growth at the relatively high temperature decreases the thickness of the silicon germanium layers from the central portion toward the outer periphery. On the other hand, the silicon is grown at relatively low temperature, and the growth at the relatively low temperature increases the thickness of the silicon layer from the central portion toward the outer periphery. As a result, the thickness of the intrinsic base is decreased from the central portion to the outer periphery without deterioration of contact with the extrinsic base, and the thin peripheral portion of the intrinsic base relieves the thick central portion from the thermal stress. Accordingly, the leakage current across the intrinsic base is drastically decreased.

The present inventor confirmed the reduction of the leakage current. The present inventor fabricated the bipolar transistor shown in FIG. 3 and the prior art bipolar transistor. The intrinsic base of the bipolar transistor according to the present invention was equal in germanium content and boron content to the intrinsic base of the prior art bipolar transistor. Although the central portion of the intrinsic base of the present invention was as thick as the central portion of the intrinsic base of the prior art, the intrinsic base of the present invention was decreased toward the outer periphery, but the intrinsic base of the present invention is constant in thickness between the central portion and the peripheral portion. The diffusion for the emitter regions was carried out through a rapid thermal anneal at 1000 degrees centigrade for 10 seconds. The base-collector junctions were reversed biased at 5 volts, and the present inventor measured the leakage current for the bipolar transistor according to the present invention and the prior art bipolar transistor. The leakage current of bipolar transistor of the present invention is plotted on line PL1, and the leakage current of the prior art bipolar transistor is varied on line PL2.

Comparing plots PL1 and PL2, the leakage current of the prior art bipolar transistor ranges from $10^{-9}$ ampere to $10^{-6}$ ampere, and the leakage current of the present invention is on the order of $10^{-10}$ ampere. Thus, the present inventor confirmed the intrinsic base decreased in thickness toward the periphery is effective against the leakage current.

When the bipolar transistors according to the present invention form a semiconductor integrated circuit device, there is only small probability of a defective bipolar transistor due to large leakage current, and production yield is surely enhanced.

Another advantage of the bipolar transistor according to the present invention is reduction of base resistance. In fact, base resistance of the bipolar transistor was decreased 15 percent compared to the base resistance of the prior art bipolar transistor. This advantage is derived from the poly-crystal silicon germanium layer 31d' being thinner than the poly-crystal silicon germanium layer of the prior art bipolar transistor. If the germanium content is increased 10 percent, the diffusion coefficient of boron takes a figure down. In other words, the boron is not widely diffused in the silicon germanium in comparison with the silicon. The p-type poly-crystal silicon germanium layer 31d' is grown during the undoped/heavily doped p-type silicon germanium layers 31a/31b, and merely forms a part of the p-type poly-crystal laminated structure 31d. For this reason, the boron is easily diffused from the over-hang portion 27a through the thin poly-crystal silicon germanium layer 31d', and effectively decreases the resistance of the extrinsic base of the bipolar transistor according to the present invention.

Second Embodiment

Figure 6:
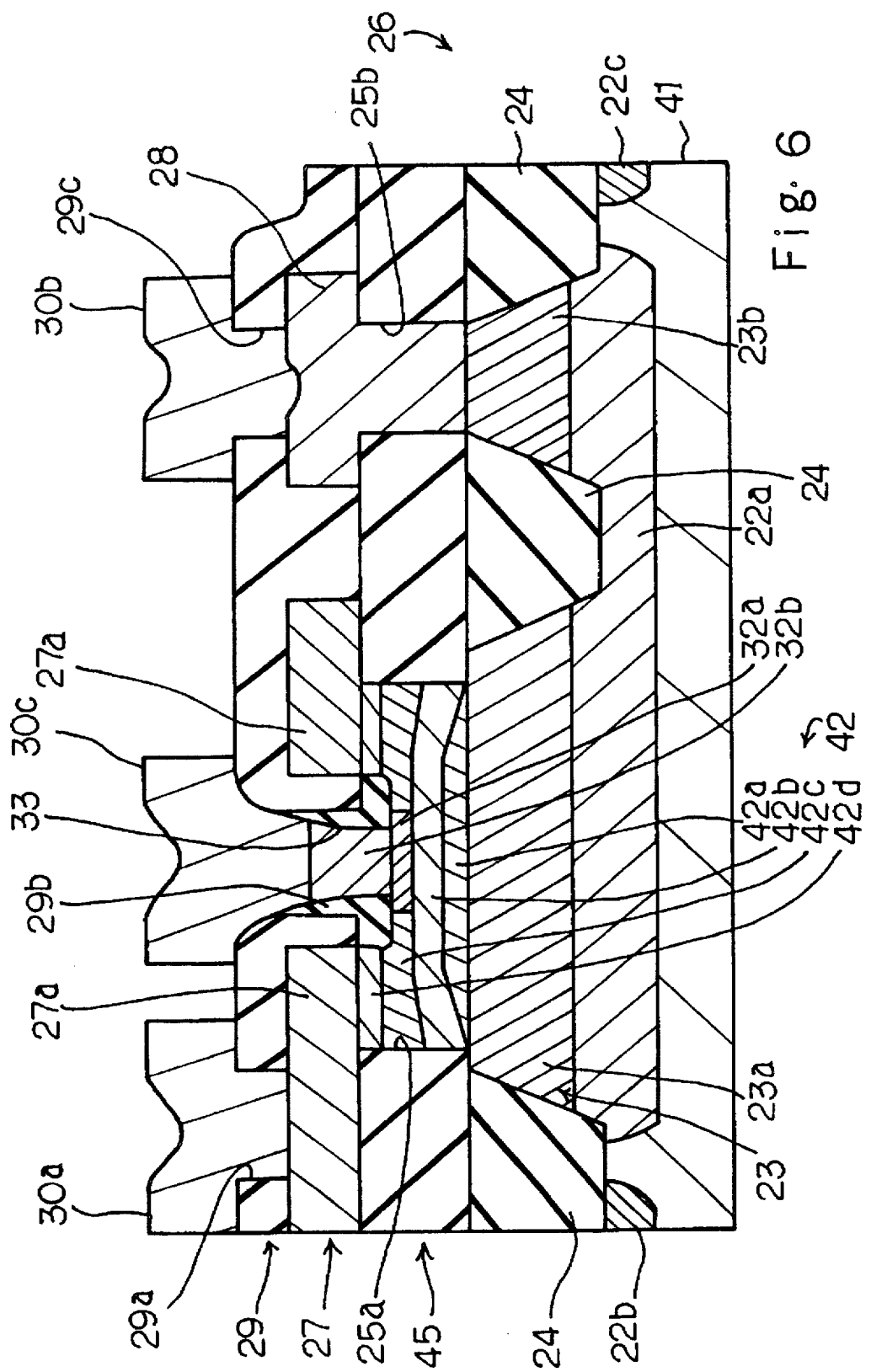
FIG. 6 is a cross sectional view showing the structure of another bipolar transistor according to the present invention.

Turning to FIG. 6 of the drawings, another bipolar transistor embodying the present invention is fabricated on a lightly doped p-type single crystal silicon substrate 41. The bipolar transistor shown in FIG. 6 is similar to the first embodiment except for a base structure 42, and the other regions and layers are labeled with the same references designating corresponding regions and layers of the first embodiment.

The base structure 42 includes an intrinsic base and an extrinsic base as similar to the first embodiment. The intrinsic base is constituted by an undoped single crystal silicon germanium layer 42a and a heavily doped p-type single crystal silicon germanium graded layer 42d. The undoped single crystal silicon germanium layer 42a is decreased in thickness from the flat central portion below the hole 29b toward the outer periphery as similar to that of the first embodiment. The heavily doped p-type single crystal silicon germanium graded layer 42b decreases the germanium content toward the heavily doped n-type emitter region 32a, and the germanium content is varied from 10 percent to zero.

The undoped single crystal silicon germanium layer 42a is grown under similar conditions to the undoped single crystal silicon germanium layer 31a. The heavily doped p-type single crystal silicon germanium graded layer 42d is grown at 590 degrees centigrade and boron concentration of $7 \times 10^{18}$ cm$^{-3}$, and the flat central portion is 450 angstroms in thickness. The heavily doped p-type silicon germanium graded layer 42b increases the thickness under the over-hang portion 27a, and the thickness of the peripheral portion under the over-hang portion 27a is as thick as 800 angstroms. The reason for the thick peripheral portion is Cl$_2$ added to the process gas. Cl$_2$ restricts the growth under the hole 29b, and makes the peripheral portion thicker than the flat central portion.

The extrinsic base is constituted by the heavily doped p-type single crystal silicon layer 42c and the p-type poly-crystal laminated structure 42d as similar to the first embodiment. The process sequence from the extrinsic base to the metallic electrodes 30a to 30c is similar to that of the first embodiment, and description is omitted for avoiding repetition.

Even though the heavily doped p-type single crystal silicon germanium graded layer 42b is increased in thickness below the over-hang portion 27a, the critical thickness for dislocation is increased in value by decreasing the germanium content, and only a small amount of dislocation takes place.

As a result, the silicon oxide layer 45 is increased in thickness compared to the silicon oxide layer 5. The total thickness of the selective epitaxially grown layers 42a, 42b and 32a is 850 angstroms, i.e., (150+450+250) angstroms, and the silicon oxide layer 45 is increased from 1000 angstroms thick to 1400 angstroms thick. In detail, the total thickness of the epitaxially grown layers 42b and 42c is estimated at 1250 angstroms, i.e., (450+250)×(8/4.5) where "450" and "250" are thickness of the heavily doped p-type single crystal silicon germanium graded layer 42b and the thickness of the heavily doped single crystal silicon layer 42c in angstrom and (8/4.5) is indicative of growing ratio of the peripheral portions below the over-hang portion 27a to the central portions below the hole 29b. The p-type poly-crystal laminated structure 31d is on the order of 150 angstroms thick. The total thickness is 1400 angstroms, and the silicon oxide layer 45 is adjusted to the total thickness.

Thus, the bipolar transistor implementing the second embodiment has the silicon oxide layer 45 thicker than the silicon oxide layer 5, and, accordingly, the parasitic capacitance between the over-hang portion 27a and the collector region 23a is effectively decreased. This results in speed-up.

Although particular embodiments of the present invention have been shown and described, it will be obvious to those skilled in the art that various changes and modifications may be made without departing from the spirit and scope of the present invention. For example, the bipolar transistor according to the present invention may form a part of a large scale integrated circuit, and field effect transistors may form a semiconductor device together with the bipolar transistors according to the present invention.

The semiconductor materials for the collector and the base structure and the insulating material for defining the hollow space are not limited to those of the embodiment. The base structure according to the present invention is effective against dislocation insofar as the lattice constants and/or the thermal expansion coefficients are different between the materials formed in and around the hollow space.

The composition of silicon germanium and the dopant concentrations of the semiconductor layers are not limited to those of the first and second embodiments.

The n-p-n type bipolar transistors are described hereinbefore. A p-n-p type bipolar transistor is similarly fabricated on an n-type silicon substrate by exchanging the conductivity types of the semiconductor layers.

What is claimed is:

1. A semiconductor device having a bipolar transistor, said bipolar transistor comprising:

a collector region of a first conductivity type formed of single crystal silicon;

a first insulating layer formed of a first insulating material and on said collector region, and having a first hole exposing a surface of said collector region;

a base electrode of a second conductivity type formed on said first insulating layer, and having an over-hang portion projecting over said first hole so as to define a second hole nested into said first hole, said second conductivity type being opposite to said first conductivity type;

a base structure of said second conductivity type formed in said first hole, and held in contact with said surface of said collector region, said base structure including an intrinsic base layer of single crystal silicon germanium different in thermal expansion coefficient from said single crystal silicon and said first insulating material, said intrinsic base layer including an oblique surface and decreasing in thickness from an interior portion of said intrinsic base layer below said second hole toward an outer periphery of said intrinsic base layer, said intrinsic base layer also having a first intrinsic base sub-layer of said single crystal silicon germanium, a dopant concentration of which is less than $4 \times 10^{16}$ cm$^{-3}$, and a second intrinsic base sub-layer of said single crystal silicon germanium laminated on said first intrinsic base sub-layer and more heavily doped than said first intrinsic base sub-layer, said base structure also including an extrinsic base layer formed between a lower surface of said over-hang portion and said intrinsic base layer; and an emitter region of said first conductivity type formed on said single crystal silicon, and held in contact with a surface of a central portion of said intrinsic base layer below said second hole and a side surface of said extrinsic base layer.

2. The semiconductor device as set forth in claim 1, in which said over-hang portion has a first distance from a first inner edge of said first insulating layer defining said first hole to a second inner edge thereof defining said second hole, and said first distance is less than a thickness of said first insulating layer and greater than a thickness of said intrinsic base layer.

3. The semiconductor device as set forth in claim 1, in which a thickness of said intrinsic base layer measured from a point on said oblique surface is less than a critical thickness of said single crystal silicon germanium.

4. The semiconductor device as set forth in claim 1, in which said single crystal silicon germanium is expressed as $Si_{0.9}Ge_{0.1}$.

5. The semiconductor device as set forth in claim 1, in which said first intrinsic base sub-layer is decreased in thickness toward said outer periphery of said intrinsic base layer, and said second intrinsic base sub-layer is decreased in thickness toward said outer periphery of said intrinsic base layer.

6. The semiconductor device as set forth in claim 1, in which said extrinsic base layer has a first extrinsic base sub-layer formed of said single crystal silicon germanium and held in contact with said intrinsic base layer, and a second extrinsic base sub-layer formed of said single crystal silicon and said single crystal silicon germanium and between said over-hang portion and said first extrinsic base sub-layer.

7. A semiconductor device having a bipolar transistor, said bipolar transistor comprising:

a collector region of a first conductivity type formed of single crystal silicon;

a first insulating layer formed of a first insulating material and on said collector region, and having a first hole exposing a surface of said collector region;

a base electrode of a second conductivity type formed on said first insulating layer, and having an over-hang portion projecting over said first hole so as to define a second hole nested into said first hole, said second conductivity type being opposite to said first conductivity type;

a base structure of said second conductivity type formed in said first hole, and held in contact with said surface of said collector region, said base structure including an intrinsic base layer of single crystal silicon germanium different in thermal expansion coefficient from said single crystal silicon and said first insulating material, said intrinsic base layer including an oblique surface and decreasing in thickness from an interior portion of said intrinsic base layer below said second hole toward an outer periphery of said intrinsic base layer, said intrinsic base layer having a first intrinsic base sub-layer of said single crystal silicon germanium, a dopant concentration of which is less than $4\times10^{16}\text{cm}^{-3}$, and a second intrinsic base sub-layer of said single crystal silicon germanium laminated on said first intrinsic base sub-layer and more heavily doped than said first intrinsic base sub-layer, the germanium content of said second intrinsic base sub-layer being decreased, from a first boundary with said first intrinsic base sub-layer to a second boundary with an emitter region, said base structure also including an extrinsic base layer formed between a lower surface of said over-hang portion and said intrinsic base layer, and an emitter region of said first conductivity type formed of said single crystal silicon and held in contact with a surface of a central portion of said intrinsic base layer below said second hole and a side surface of said extrinsic base layer.

8. The semiconductor device as set forth in claim 7, in which said single crystal silicon germanium for said first intrinsic base sub-layer is expressed as $Si_{0.9}Ge_{0.1}$, and the single crystal silicon germanium for said second intrinsic base sub-layer is varied from $Si_{0.9}Ge_{0.1}$ to $Si_{1.0}Ge_{0}$.

9. The semiconductor device as set forth in claim 7, in which said first intrinsic base sub-layer has said oblique surface, and said second intrinsic base sub-layer is increased in thickness toward said outer periphery of said intrinsic base layer.

* * * * *

UNITED STATES PATENT AND TRADEMARK OFFICE
CERTIFICATE OF CORRECTION

PATENT NO. : 5,698,890
DATED : December 16, 1997
INVENTOR(S) : FUMIHIKO SATO

It is certified that error appears in the above-indentified patent and that said Letters Patent is hereby corrected as shown below:

Claim 7, Col. 16, line 23, after "decreased" remove --,--

Signed and Sealed this

Twenty-sixth Day of May, 1998

Attest:

BRUCE LEHMAN

Attesting Officer     Commissioner of Patents and Trademarks